(12) United States Patent
Washio et al.

(10) Patent No.: US 6,313,397 B1
(45) Date of Patent: Nov. 6, 2001

(54) SOLAR BATTERY CELL

(75) Inventors: Hidetoshi Washio, Kashihara; Kunio Kamimura, Kashiba; Tomoji Katsu, Ikoma-gun, all of (JP)

(73) Assignee: Sharp Kabushiki Kaisha (JP)

( * ) Notice: Subject to any disclaimer, the term of this patent is extended or adjusted under 35 U.S.C. 154(b) by 0 days.

(21) Appl. No.: 09/385,376

(22) Filed: Aug. 30, 1999

(30) Foreign Application Priority Data

Aug. 31, 1998 (JP) .................................................. 10-244528

(51) Int. Cl.$^7$ .......................... H01L 31/0236; H01M 6/30
(52) U.S. Cl. ......................... 136/256; 136/252; 429/111
(58) Field of Search .................... 136/252, 256; 429/111

(56) References Cited

U.S. PATENT DOCUMENTS

| | | | | |
|---|---|---|---|---|
| 4,320,250 | * | 3/1982 | Corwin et al. | 136/256 |
| 4,338,481 | * | 7/1982 | Mandelkorn | 136/255 |
| 4,348,254 | | 9/1982 | Lindmayer | 156/647 |
| 4,379,944 | * | 4/1983 | Borden et al. | 136/256 |
| 4,427,839 | * | 1/1984 | Hall | 136/255 |
| 5,080,725 | * | 1/1992 | Green et al. | 136/256 |
| 5,100,478 | * | 3/1992 | Kawabata | 136/249 |
| 5,282,902 | * | 2/1994 | Matsuyama | 136/249 |
| 5,704,992 | * | 1/1998 | Willeke et al. | 136/255 |
| 5,725,006 | * | 3/1998 | Kawama et al. | 136/251 |
| 5,759,292 | * | 6/1998 | Arimoto et al. | 136/256 |
| 5,817,396 | * | 10/1998 | Perlo et al. | 428/141 |
| 5,977,477 | * | 11/1999 | Shiozaki | 136/256 |

FOREIGN PATENT DOCUMENTS

| | | | |
|---|---|---|---|
| 195 22 539 | 1/1997 | (DE) . | |
| 6 260670 | 9/1994 | (JP) . | |
| 07094764 | 4/1995 | (JP) . | |
| 07142755 | 6/1995 | (JP) . | |
| 7 142755 | 6/1995 | (JP) . | |
| 07094764 | * | 7/1999 | (JP) .................. H01L/31/04 |

OTHER PUBLICATIONS

Zhao et al, "24% Efficient Perl Structure Silicon Solar Cells", *IEEE*, pp. 333–335, 1990.

* cited by examiner

*Primary Examiner*—Harold Pyon
*Assistant Examiner*—Michael C. Miggins
(74) *Attorney, Agent, or Firm*—Nixon & Vanderhye PC

(57) ABSTRACT

A solar battery cell having textures formed in a texture region on a light-receiving surface thereof, except for a site where a surface electrode is formed, wherein the textures formed in a peripheral portion of the texture region have a different size from the textures formed in an inside portion located inside of the peripheral portion.

19 Claims, 12 Drawing Sheets

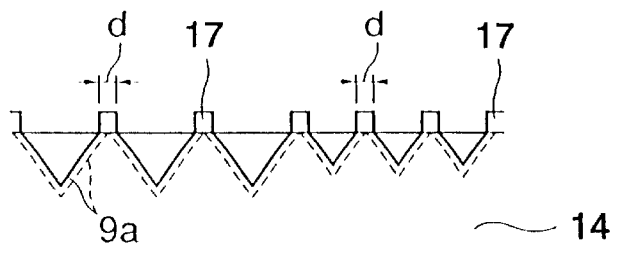
Fig. 3A
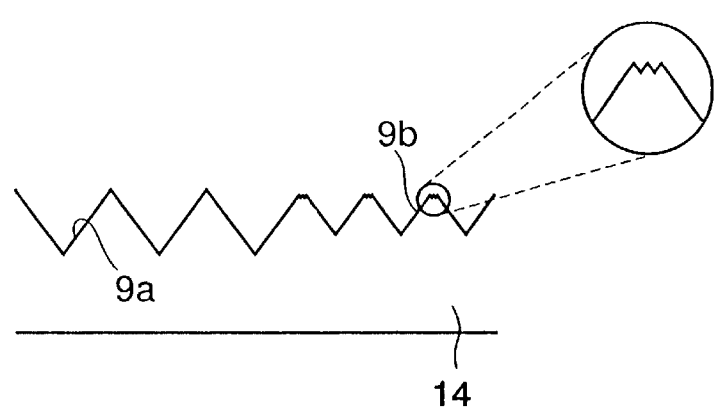
Fig. 3B
Fig. 3C
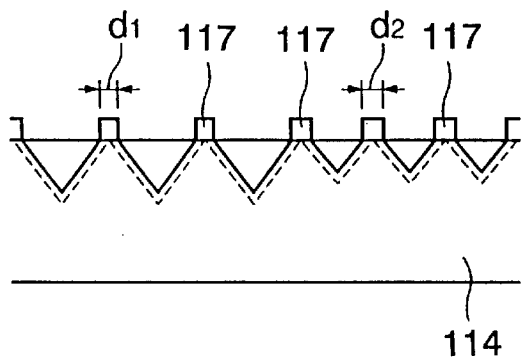
Fig. 4A
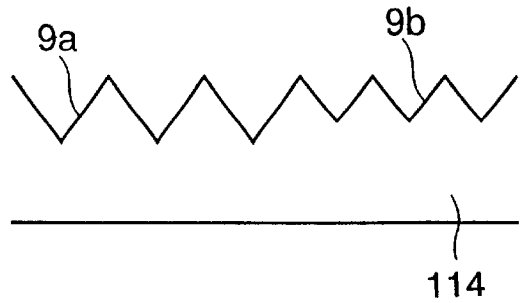
Fig. 4B

SOLAR BATTERY CELL

CROSS-REFERENCES TO RELATED APPLICATIONS

This application is related to Japanese patent application No. HEI 10(1998)-244528 filed on Aug. 31, 1998 whose priority is claimed under 35 USC §119, the disclosure of which is incorporated herein by reference in its entirety.

BACKGROUND OF THE INVENTION

1. Field of the Invention

The present invention relates to a solar battery cell and a method for manufacturing the same, and more particularly to a solar battery cell having a non-reflective surface configuration (hereafter referred to as "textures") and a method for manufacturing the same.

2. Description of the Related Art

FIG. 8 shows an example of a cell cross-section of a conventional solar battery cell. This solar battery cell $1_0$ is generally referred to as NRS/BSF (Non-Reflective Surface and Back Surface Field) type solar battery cell, and comprises a P-type silicon substrate 4 whose light-receiving surface includes an $N^+$-type diffusion layer 3 formed by thermal diffusion of N-type impurity ions so as to effectively take in carriers generated by light energy, and includes uneven textures (texture pieces) 8 having an inverted-pyramid shape formed so as to reduce surface reflection. An oxide film layer 7 is formed on the $N^+$-type diffusion layer 3 so as to reduce recombination of the carriers in the surface. Also, in an opening where the oxide film layer 7 is not formed, a surface electrode 2 is formed in a comb-like shape for effectively taking out the generated electricity and is directly connected to the $N^+$-type diffusion layer 3. Further, the oxide film layer 7 is covered with an anti-reflection film 10 for reducing the surface reflection of incident light.

A back surface of the P-type silicon substrate 4 includes a $P^+$-type diffusion layer 5 formed by thermal diffusion of P-type impurity ions so as to increase the amount of carriers generated by light energy. An oxide film layer 7 for reducing recombination of the carriers and a back surface electrode 6 for reflecting a long-wavelength light which may escape away from the back surface and for taking out the generated electricity are formed almost over an entire surface of the $P^+$-type diffusion layer 5. The $P^+$-type diffusion layer 5 and the back surface electrode 6 are connected via an opening (not shown) formed in the oxide film layer 7.

In the solar battery cell $1_0$ of NRS/BSF type such as shown in FIG. 8, the textures 8 formed on the light-receiving surface serves to allow multiple reflection of incident light so as to increase the amount of light that reaches the inside of the cell. Therefore, the size, the area of the formed textures, the configuration of the textures and the like have a great influence on an output power by changing the energy conversion efficiency of the generated electricity. Accordingly, how the size and the shape of these textures 8 are to be configured is an extremely important factor in manufacturing the solar battery cell.

In other words, the incident light undergoes multiple reflection on the light-receiving surface due to these textures 8, as shown in FIG. 9, whereby the surface reflectivity is reduced. As a result of this, the amount of light absorbed by the substrate 4 increases, whereby more electric currents are generated. Especially, in the case of a solar battery cell for use in space, it receives radioactive rays (cosmic rays). In this case, if the textures 8 are present on the substrate 4, the incident light is refracted at the light-receiving surface to be incident in an oblique direction into the substrate, whereby the carriers generated near a PN-junction formed about the surface of the solar battery cell increase in number and the influence on the carrier lifetime by deterioration due to the radioactive rays can be reduced.

Accordingly, to form a larger texture area on the light-receiving surface is effective in improving the output of the solar battery cell $1_0$.

Therefore, the conventional solar battery cell $1_0$ has a configuration of textures 8 such as shown in FIGS. 10A, 10B, 10C, and 11. Here, FIG. 10A is a plan view showing an entire solar battery cell. FIG. 10B is a partially enlarged view of FIG. 10A. FIG. 10C is an enlarged plan view showing a portion indicated by symbol B in FIG. 10A. FIG. 11 is an enlarged plan view showing a portion indicated by symbol D in FIG. 10C. In these Figures, a solar battery cell 10, a grid electrode 2, a bar electrode 3, and a connector (pad) electrode 4 for taking out an output power are shown.

The conventional solar battery cell 1a has a structure in which the textures 8 are arranged both in longitudinal and lateral directions (in a checkered configuration) in all the regions except for a site where the surface electrode 2 is formed. The textures 8 formed at the sites other than the outer perimeter 18 have an uneven shape of inverted-pyramid type (having a square shape in a plan view) as shown in FIG. 11, and all have the same size and the same shape. Also, all the distances d between adjacent textures 8 are the same. Further, textures 8 are also formed on the outer perimeter 18 of the solar battery cell $1_0$, as shown in FIG. 10B.

Hitherto, in order to form the textures 8 having a shape such as shown in FIGS. 8 to 11, the steps shown in FIGS. 12A to 12G, for example, are carried out.

First, referring to FIG. 12A, a silicon substrate 4 is prepared. Then, referring to FIG. 12B, an oxide film layer 7 is formed on a surface of the silicon substrate 4 by thermal oxidation or CVD. Subsequently, referring to FIG. 12C, a resist 15 is applied on the oxide film layer 7. Then, referring to FIG. 12D, a region having a predetermined texture pattern on a light-receiving surface is exposed to light and developed. By this process, a texture pattern is formed on the oxide film layer 7 by means of the resist 15. Subsequently, referring to FIG. 12E, an unnecessary portion of the oxide film layer 7 is removed by etching and then the resist 15 is removed. By this process, a texture pattern is formed on the silicon substrate 4 by means of the oxide film layer 7. Referring to FIG. 12F, the silicon substrate 4 in this state is etched for a predetermined period of time by using an etchant liquid having a predetermined temperature and a predetermined concentration, such as a high-temperature alkali solution. In the case of the silicon substrate 4, each crystal face has a different ratio of corrosion by a chemical agent. Fine inverted-pyramid type textures 8 can be formed by an anisotropic etching treatment using this property. Finally, referring to FIG. 12G, the oxide film layer 7 is removed to complete the textures 8 on the light-receiving surface of the silicon substrate 4.

However, conventional solar battery cells have problems such as indicated by the following (1) and (2).

(1) As described above, each texture 8 formed on the silicon substrate 4 at the sites other than the outer cell perimeter in a conventional solar battery cell has the same size and the same shape, as shown in FIG. 11, and moreover all the distances d between adjacent textures 8 are the same.

For this reason, the area of the region on the solar battery cell $1_0$ where the textures 8 are formed may be small. Namely, it is not possible to form a texture pattern having the same size around the electrode 2 on the region where the textures 8 are formed, so that the portion around the electrode 2 is made flat. As a result of this, the area occupied by the flat portion on the light-receiving surface of the cell will be large and, in accordance therewith, the effect of reducing the reflectivity will be small, leading to decrease in the output power of a solar battery cell $1_0$.

(2) Also, in the conventional solar battery cell $1_0$, textures are also formed on the outer perimeter 18 of the solar battery cell $1_0$, as shown in FIG. 10B. Therefore, cracks or possibly cleavages are generated on the outer perimeter 18 of the cell $1_0$ in cutting out the cells in a dicing step even during the manufacture of the solar battery cell $1_0$. This makes it difficult to handle the solar battery cell $1_0$ and leads to decrease in the productivity and contamination of the production line.

SUMMARY OF THE INVENTION

The present invention has been made in view of these circumstances and the first object thereof is to provide a solar battery cell with improved output power by forming a larger texture, as compared with a conventional solar battery cell, and the second object thereof is to provide a solar battery cell with a texture structure in which cracks and cleavages are not easily generated.

In order to solve the above-mentioned problems, the present invention is constructed as follows.

The present invention provides a solar battery cell having textures formed in a texture region on a light-receiving surface thereof except for a site where a surface electrode is formed, wherein the textures formed in a peripheral portion of the texture region have a different size from the textures formed in an inside portion located inside of the peripheral portion.

The present invention also provides a method of manufacturing a solar battery cell having textures formed in a texture region on a light-receiving surface thereof except for a site where a surface electrode is formed, wherein the textures formed in a peripheral portion of the texture region have a different size from the textures formed in an inside portion located inside of the peripheral portion, the method comprising forming a masking pattern with an oxide film on a substrate and etching the substrate using the masking pattern as a mask, thereby to form lattice-shaped textures in the substrate, wherein a line width of the masking pattern located on a texture region where the larger textures are to be formed is smaller than a line width of the masking pattern located on a texture region where the smaller textures are to be formed.

BRIEF DESCRIPTION OF THE DRAWINGS

The present invention will be better understood from the following detailed description of preferred embodiments of the invention, taken in conjunction with the accompanying drawings, in which:

FIGS. 3A and 3B are cross-sectional views showing steps before and after an etching process in forming textures with different sizes, where the distance between adjacent textures is maintained constant irrespective of the size of each texture;

FIGS. 4A and 4B are cross-sectional views showing steps before and after an etching process in forming textures with different sizes, where the distance between adjacent textures is varied in accordance with the size of each texture;

DETAILED DESCRIPTION OF THE PREFERRED EMBODIMENTS

Figure 1A:
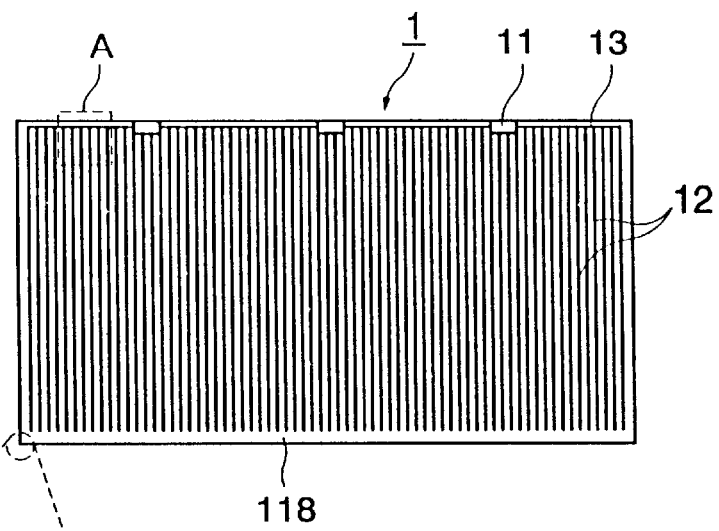
FIG. 1A is a plan view showing an example of a solar battery cell according to an embodiment of the present invention.

In the present invention, the term "textures" in used to mean a non-reflective surface configuration. The non-reflective surface configuration may be a surface configuration having a reflectivity of about 10% or less when a mirror surface is assumed to have a reflectivity of 100%. The non-reflective surface configuration is preferably such that the surface absorbs light substantially without reflection. Such a surface configuration may include, for example, rectangular openings with inverted-pyramid recesses or openings with a cavity formed inside. The solar battery cell of the present invention has a structure in which numerous fine textures are formed in the light-receiving surface thereof.

In the present invention, the textures formed in the peripheral portion of the texture region may have a smaller size than the textures formed in the inside portion of the texture region.

Also, a distance between adjacent textures formed in the peripheral portion of the texture region may be different from a distance between adjacent textures formed in the inside portion of the texture region. In this case, if the textures formed in the peripheral portion of the texture region have a smaller size than the textures formed in the inside portion of the texture region, the distance between adjacent textures formed in the peripheral portion of the texture region is preferably larger than the distance between adjacent textures formed in the inside portion of the texture region.

In the solar battery cell of the present invention, the light-receiving surface preferably includes a non-texture region which is formed on an outer perimeter of the cell and in which textures are not formed. If the non-texture region is formed, the non-texture region preferably has a width of 50 μm or more.

Also, the present invention provides a solar battery cell having textures formed in a texture region on a light-receiving surface thereof except for a site where a surface electrode is formed, wherein the textures formed in a peripheral portion of the texture region has a different shape from the textures formed in an inside portion located inside of the peripheral portion.

In the above-mentioned construction, the textures formed in the inside portion of the texture region may have an inverted-pyramid shape with a square base, and the textures formed in the peripheral portion of the texture region may have an inverted-pyramid shape with a polygonal base having a pointed end. Alternatively, the textures formed in the inside portion of the texture region may have a V-groove shape, and the textures formed in the peripheral portion of the texture region may have an inverted-pyramid shape.

According to another aspect, the present invention provides a method of manufacturing a solar battery cell having textures formed in a texture region on a light-receiving surface thereof except for a site where a surface electrode is formed, wherein the textures formed in a peripheral portion of the texture region have a smaller size than the textures formed in an inside portion located inside of the peripheral portion, the method including the steps of forming a masking pattern with an oxide film on a substrate and etching the substrate using the masking pattern as a mask, thereby to form lattice-shaped textures in the substrate, wherein a line width of the masking pattern located on a texture region where the smaller textures are to be formed is larger than a line width of the masking pattern located on a texture region where the larger textures are to be formed.

Hereafter, the present invention will be described with reference to embodiments thereof shown in the attached drawings. However, these embodiments and drawings are not intended to limit the scope of the present invention.

Figure 1B:
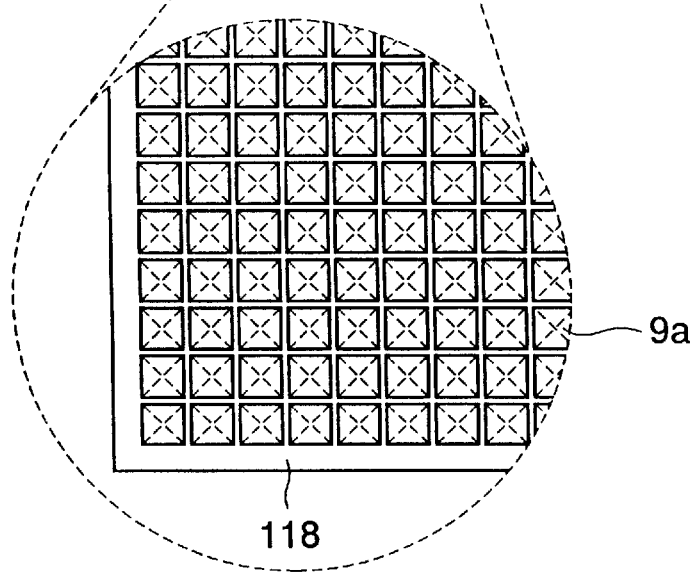
FIG. 1B is a partially enlarged view of FIG. 1A.
Figure 1C:
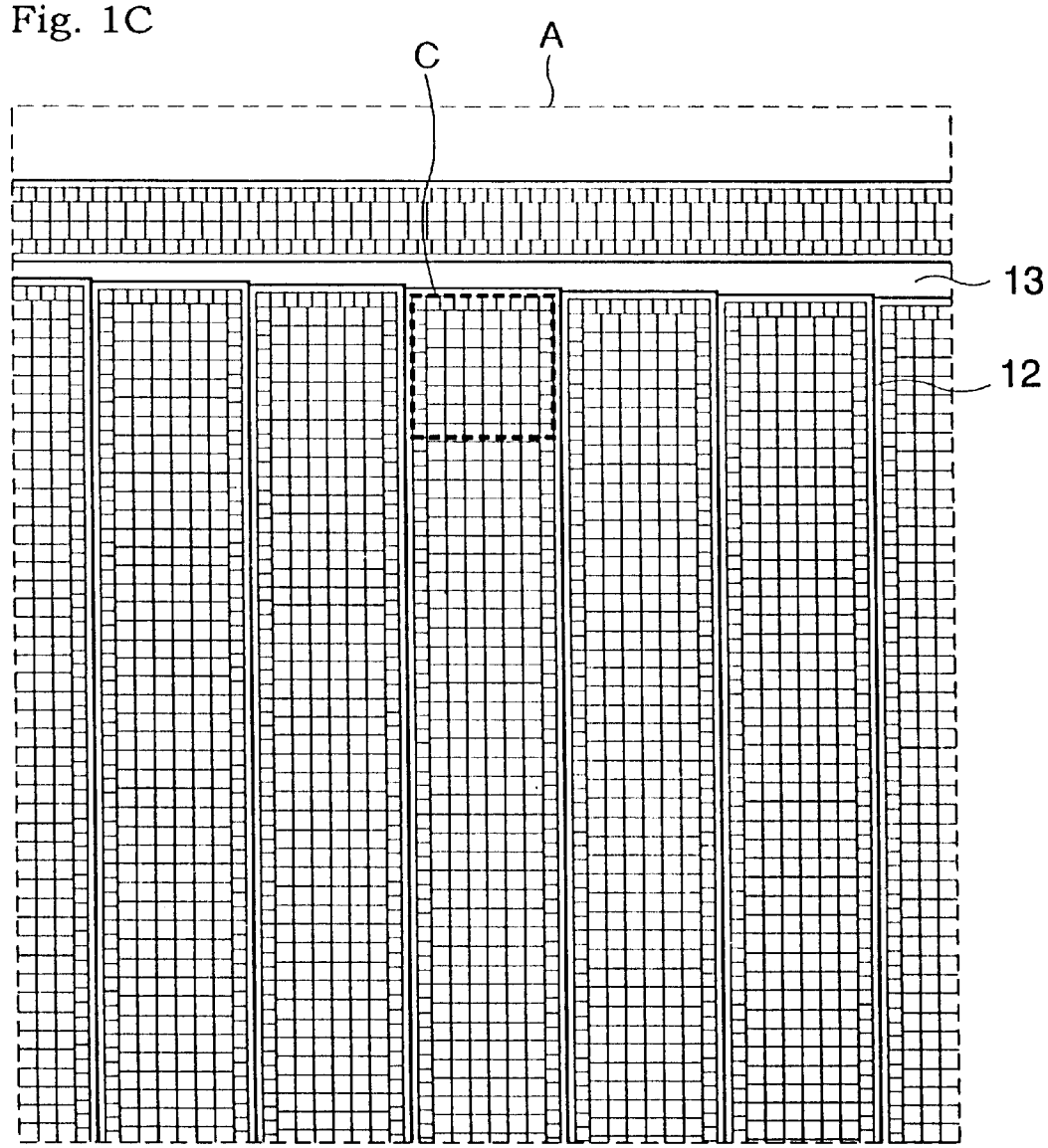
FIG. 1C is an enlarged plan view showing a portion indicated by symbol A in FIG. 1A.
Figure 2:
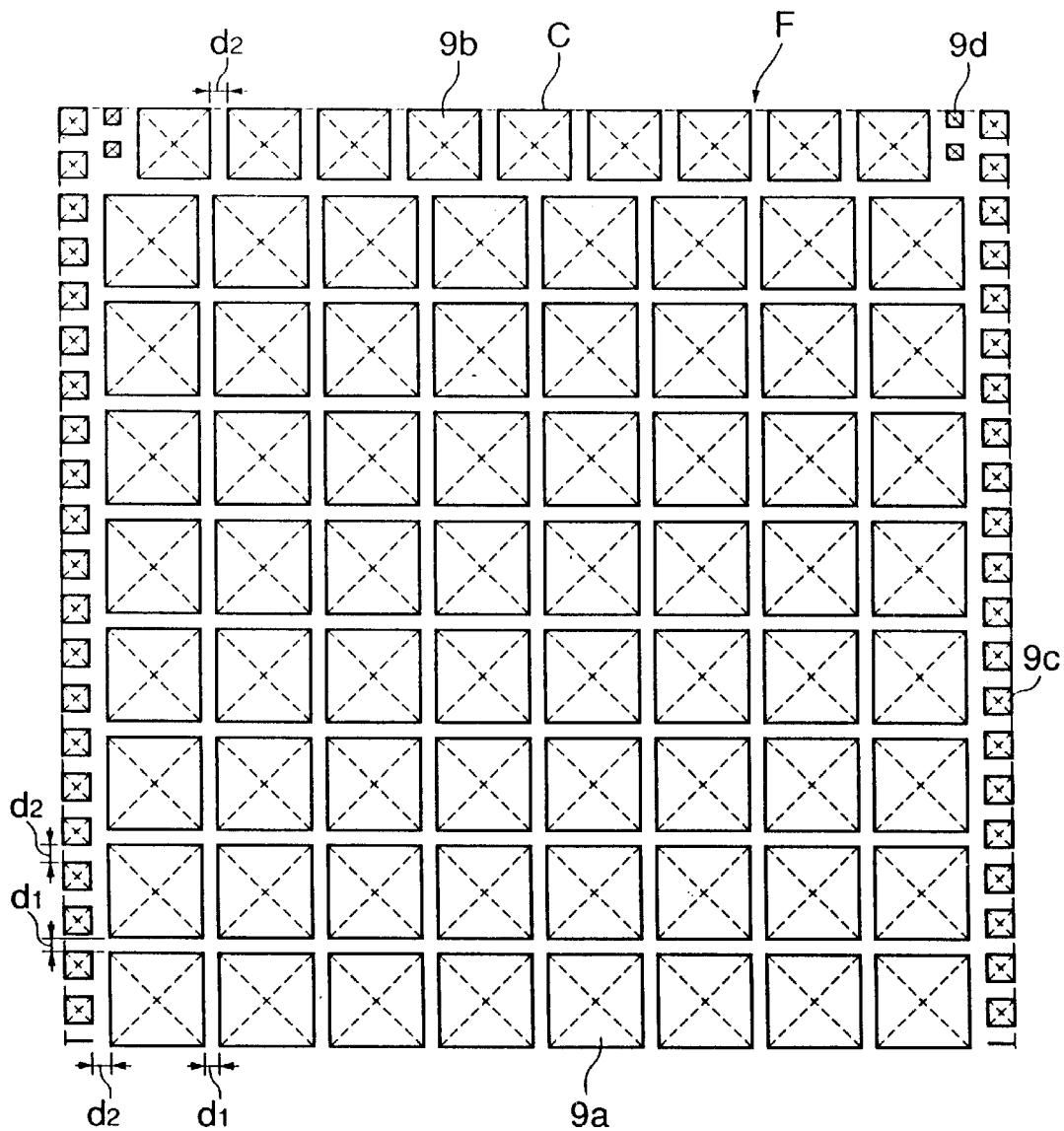
FIG. 2 is an enlarged plan view showing a portion indicated by symbol C in FIG. 1C.

FIG. 1A is a plan view showing an example of a solar battery cell according to an embodiment of the present invention. FIG. 1B is a partially enlarged view of FIG. 1A. FIG. 1C is an enlarged plan view showing a portion indicated by symbol A in FIG. 1A. FIG. 2 is an enlarged plan view showing a portion indicated by symbol C in FIG. 1C.

In these Figures, a solar battery cell 1, grid electrodes 12, a bar electrode 13, and a connector (pad) electrode 11 for taking out an output power are shown. The bar electrode 13 extends from the connector electrode 11 in a lateral direction in the Figures, and the grid electrodes 12 extend from the bar electrode 13 in a longitudinal direction in the Figures.

A light-receiving surface of the solar battery cell 1 includes a surface electrode composed of the grid electrodes 12, the bar electrode 13, and the connector electrode 11. Textures (texture pieces) are formed in a texture region except for a site where the surface electrode is formed. Electric currents generated in the texture region are taken out from the connector electrode 11 through the grid electrodes 12 and the bar electrode 13.

In this embodiment, the solar battery cell 1 has a size with a longitudinal side of about 35 mm and a lateral side of about 69 mm, and the connector electrode 11 has a size with a longitudinal side of about 1.5 mm and a lateral side of about 13 mm. The bar electrode 13 has an increasing thickness according as the bar electrode 13 approaches the connector electrode 11, and the grid electrode 12 has an increasing thickness according as the grid electrode 12 approaches the bar electrode 13. A tip end of the grid electrode 12 has a thickness of about 5 μm and a base end of the grid electrode 12 (the portion connected to the bar electrode 13) has a thickness of about 22 μm. A pitch between adjacent grid electrodes 12 is about 0.54 mm.

In this solar battery cell 1, a non-texture region (flat portion) having no textures is secured on an outer perimeter 118 of the light-receiving surface of the solar battery cell 1. Thus, by securing a non-texture region on the outer perimeter 118 of the solar battery cell 1, generation of cracks and cleavages from that region can be prevented as compared with a conventional solar battery cell, although a little decrease of output power may possibly occur. Therefore, a highly productive and highly reliable device can be provided. An outstanding effect may be obtained if the non-texture region 118 has a width of about 50 μm from an end of the cell. Also, since the width of the non-texture region is small, it is possible to prevent great decrease in the output power due to the absence of a texture structure in that region.

Textures 9a to 9d having an inverted-pyramid shape as shown in FIG. 2 are formed on a texture region F of the light-receiving surface of the solar battery cell 1 excluding the outer perimeter 118 and a surface electrode region.

In the embodiment shown in FIG. 2, the texture 9a has an inverted-pyramid shape with a square base having a side of 18 μm, the texture 9b has an inverted-pyramid shape with a square base having a side of 15 μm, the texture 9c has an inverted-pyramid shape with a square base having a side of 5 μm, and the texture 9d has an inverted-pyramid shape with a square base having a side of 3 μm. The distance $d_1$ is 2 μm, and the distance $d_2$ is 3 μm. The sizes of the textures 9a, 9b, 9c, 9d and the distances $d_1$, $d_2$ are not limited to those shown above and may be arbitrarily determined.

These textures 9a to 9d have different sizes, but they all have a square shape and are similar to each other.

Especially, in this embodiment, the size of the textures 9b to 9d formed on a peripheral portion of the texture region F is smaller than the size of the textures 9a formed in the inside of the texture region F.

This feature reduces the area of the flat portion in the texture region F and increases the area occupied by the textures 9a to 9d, as compared with a conventional solar battery cell shown in FIGS. 10A, 10B, 10C, and 11.

In addition, in this embodiment, the distance $d_2$ between adjacent textures 9b to 9d having a small shape formed on the peripheral portion of the texture region F is set to be larger than the distance $d_1$ between adjacent textures 9a having a large shape formed in the inside of the texture region F (i.e., $d_1 < d_2$).

Figure 12A:
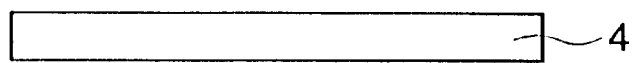
FIGS. 12A to 12G are cross-sectional views showing steps for forming a texture structure.
Figure 12B:
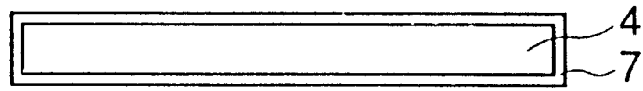
Figure 12C:
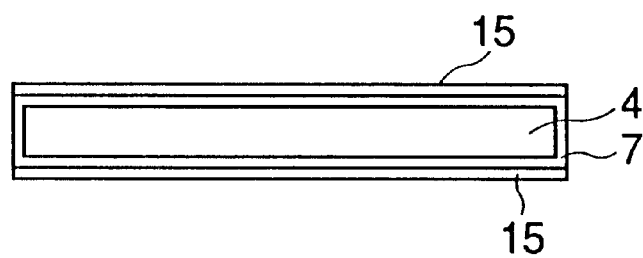
Figure 12D:
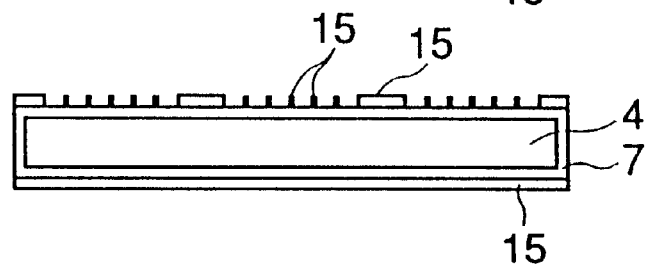
Figure 12E:
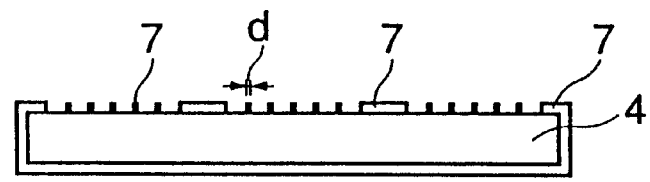
Figure 12F:
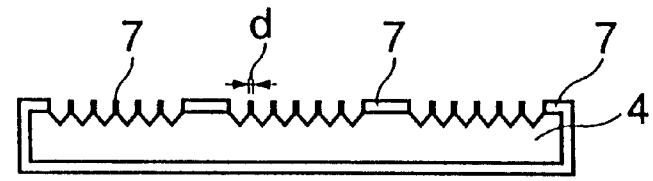
Figure 12G:
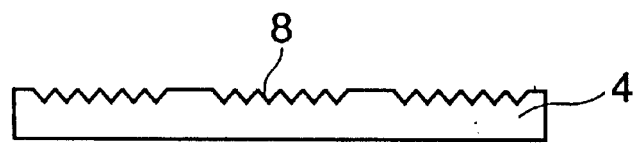

The reason for this will be hereafter explained. FIGS. 3A, 3B, 4A, and 4B are cross-sectional views showing steps before and after an etching process in forming textures with different sizes (for example, the textures 9a and 9b in FIG. 2) in etching the silicon substrate 14 in the step shown in FIG. 12F. FIGS. 3A and 3B show a case in which the distance between adjacent textures is maintained to be a constant value d irrespective of the sizes of the textures 9a and 9b, while FIGS. 4A and 4B show a case in which the distance between adjacent textures is varied ($d_1$, $d_2$) in accordance with the sizes of the textures 9a and 9b.

Referring to FIG. 3A, when the etching proceeds to the portion shown by a solid line with a texture pattern formed on a silicon substrate 14 by an oxide film layer 17 to have textures spaced apart by the same distance d, the textures begin to be etched in a lateral direction. The etching is carried out until an apex of a pyramid shown by a broken line is formed. In this case, the textures 9b having a small shape are already in an over-etched state by the lateral etching when the etching of the larger textures 9a is ended, so that the apexes of the smaller textures 9b disappear. As a result of this, the smaller textures 9b cannot be formed to have a texture structure as designed when the oxide film layer 17 is removed, as shown in FIG. 3B. This leads to a little decrease in the output power and a poor appearance.

On the other hand, referring to FIG. 4A, when the etching proceeds to the portion shown by a solid line with a texture pattern formed on a silicon substrate 114 by an oxide film layer 117 to have textures spaced apart by varying distances ($d_1$, $d_2$), the textures begin to be etched in a lateral direction. The etching is carried out until an apex of a pyramid shown by a broken line is formed. In this case, since the distance $d_2$ (width of the oxide layer 7) between adjacent textures 9b having a smaller shape is larger than the distance $d_1$ (width of the oxide layer 117) between adjacent textures 9a having a larger shape ($d_1 < d_2$), the etching of the smaller textures 9b ends simultaneously when the etching of the larger textures 9a ends. Therefore, the smaller textures 9b are not over-etched as shown in FIG. 3B. As a result, the smaller textures 9b also can be formed to have a texture structure as designed when the oxide film layer 117 is removed, as shown in FIG. 4B.

Figure 5:
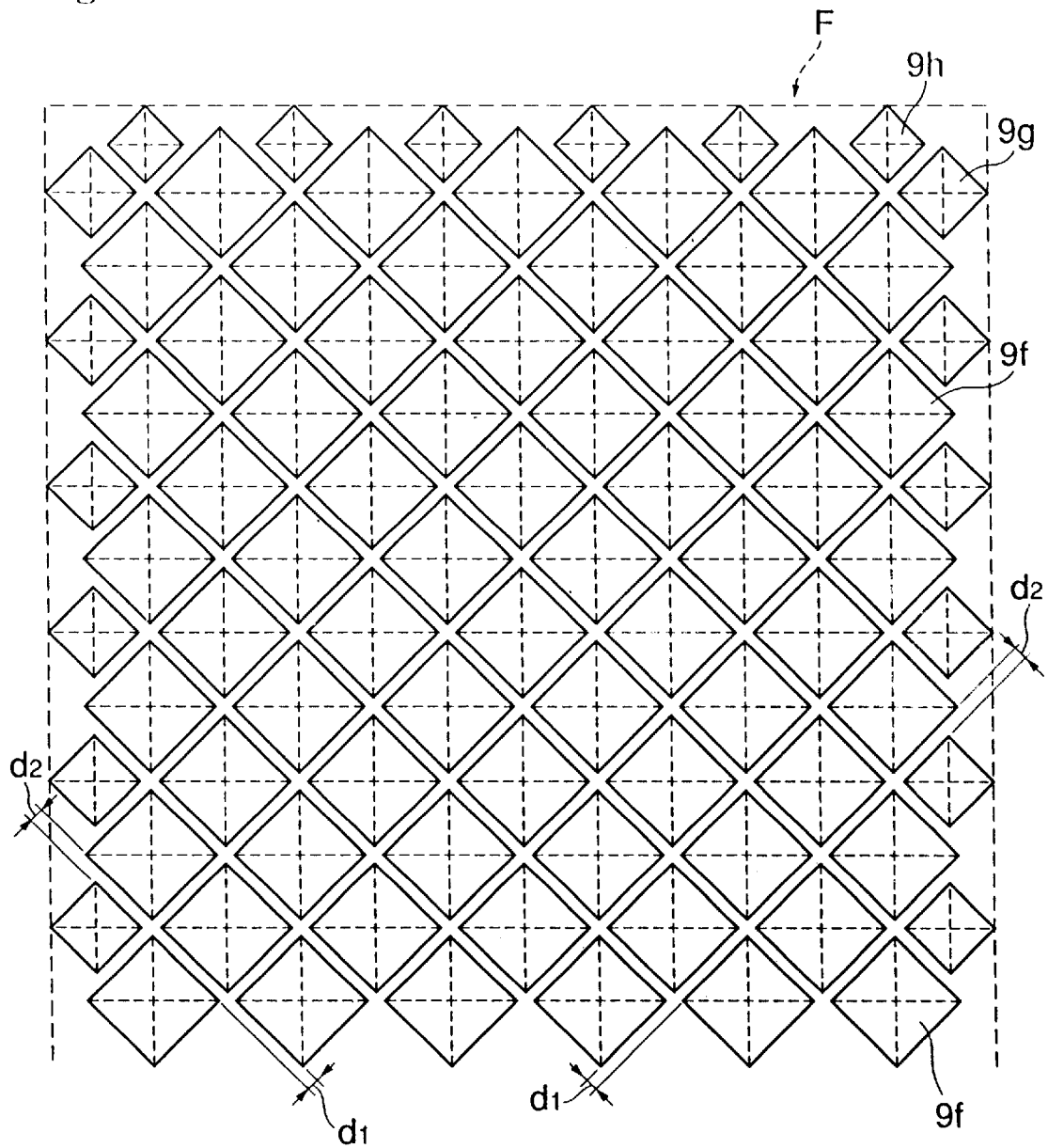
FIG. 5 is a plan view showing an example of a solar battery cell according to another embodiment of the present invention.

FIG. 5 shows a case in which the direction of forming the silicon textures is different due to the difference in the crystal direction of the substrate. Its fundamental construction is the same as the embodiments shown in FIGS. 1A, 1B, 1C, and 2. In the embodiment shown in FIG. 5, the texture 9f has an inverted-pyramid shape with a square base having a side of 18 μm, the texture 9g has an inverted-pyramid shape with a square base having a side of 15 μm, and the texture 9h has an inverted-pyramid shape with a square base having a side of 13 μm. The distance $d_1$ is 2 μm, and the distance $d_2$ is 3 μm. The sizes of the textures 9f, 9g, 9h and the distances $d_1$, $d_2$ are not limited to those shown above and may be arbitrarily determined. Thus, also in FIG. 5, textures 9f to 9h having an inverted-pyramid shape are formed on a texture region F except on an outer perimeter 118 and a surface electrode region of the solar battery cell 1. The size of the textures 9g to 9h formed in a peripheral portion of the texture region F is smaller than the size of the textures 9f formed in the inside of the texture region F.

Figure 6:
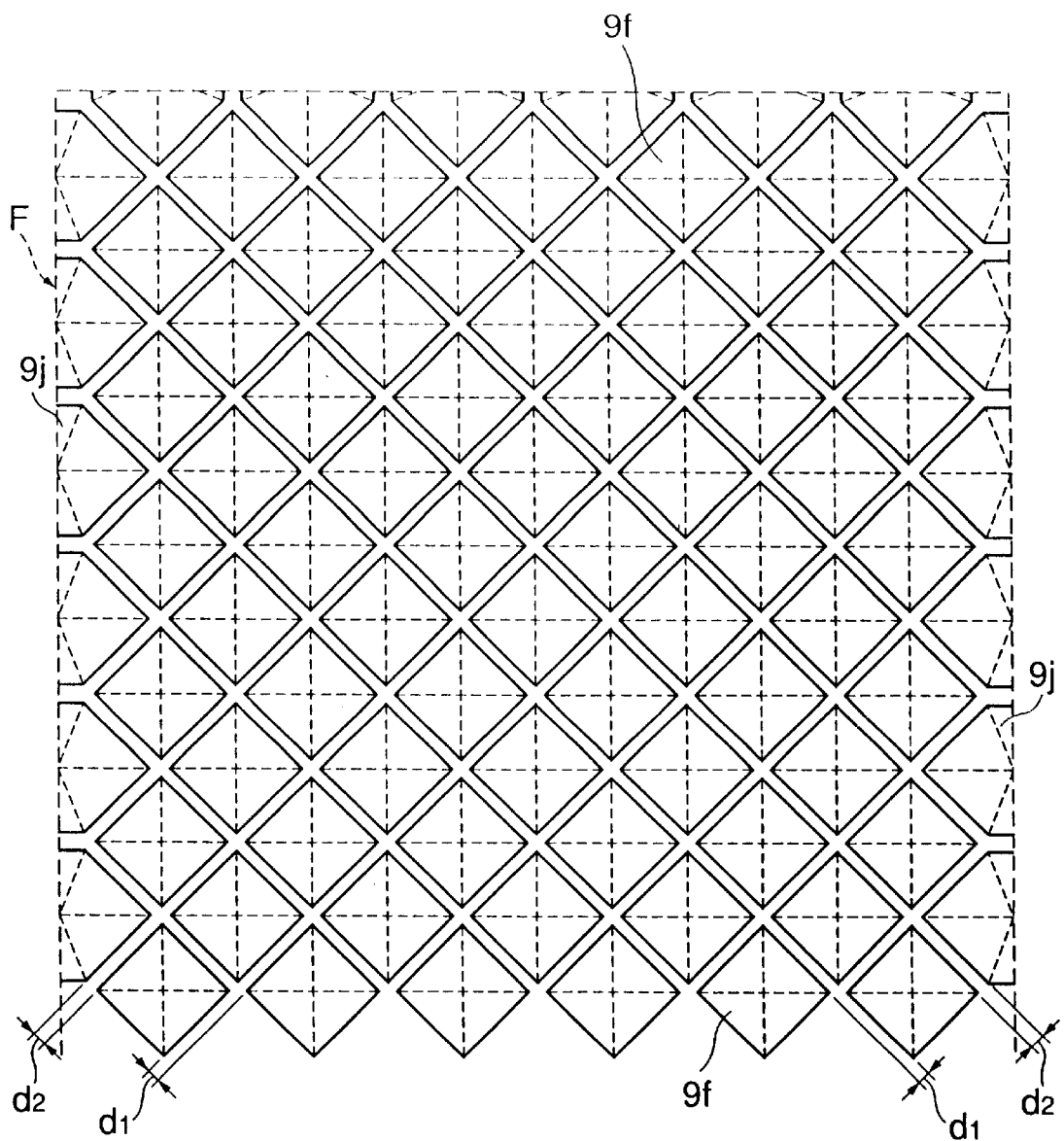
FIG. 6 is a plan view showing an example of a solar battery cell according to still another embodiment of the present invention.

FIG. 6 shows another, modified embodiment of the present invention. In a texture region F, textures 9j and 9f are formed in the peripheral portion and in the inside portion of the texture region F, respectively. The textures 9f formed in the inside portion of the texture region F have an inverted-pyramid shape with a square base, whereas the textures 9j formed in the peripheral portion of the texture region F do not have a square base but a polygonal base with a pointed end. This can ensure a larger texture area occupied by the textures 9j and 9f as compared with a conventional cell shown in FIGS. 10A, 10B, 10C, and 11.

Figure 7:
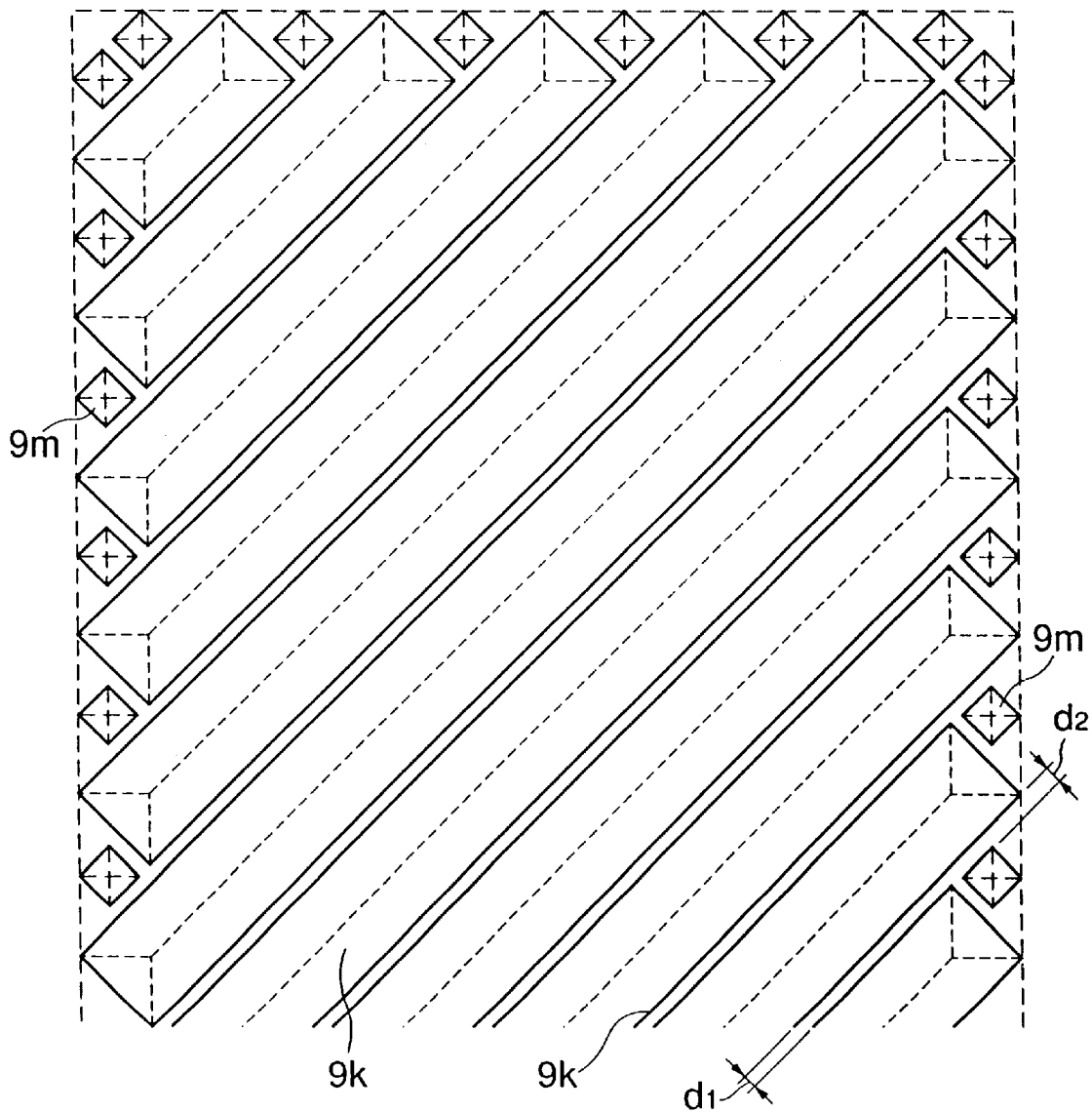
FIG. 7 is a plan view showing an example of a solar battery cell according to still another embodiment of the present invention.
Figure 8:
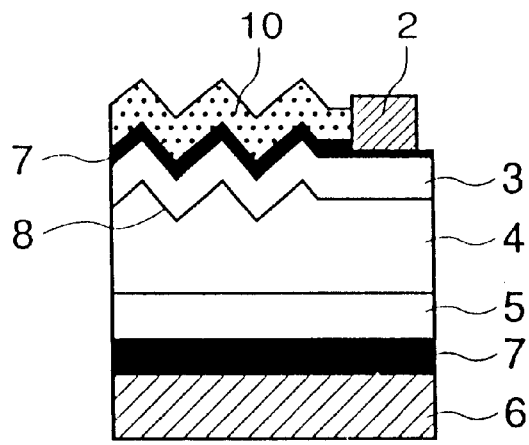
FIG. 8 is a cross-sectional view showing a solar battery cell of NRS/BSF type.
Figure 9:
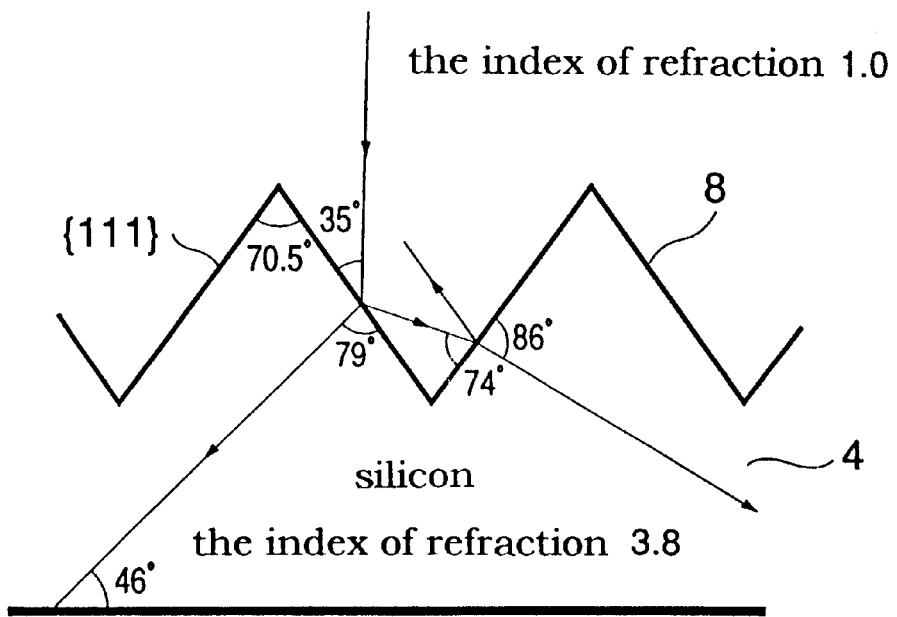
FIG. 9 is an explanatory view showing reflection and refraction of light on a texture surface.
Figure 10A:
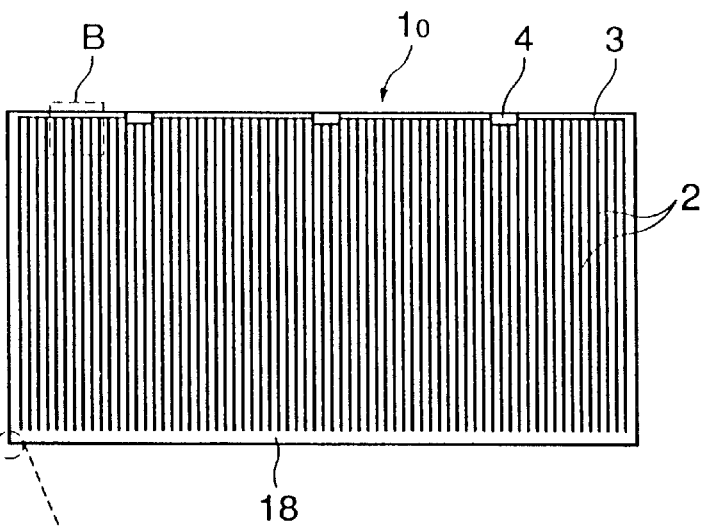
FIG. 10A is a plan view showing an entire solar battery cell.
Figure 10B:
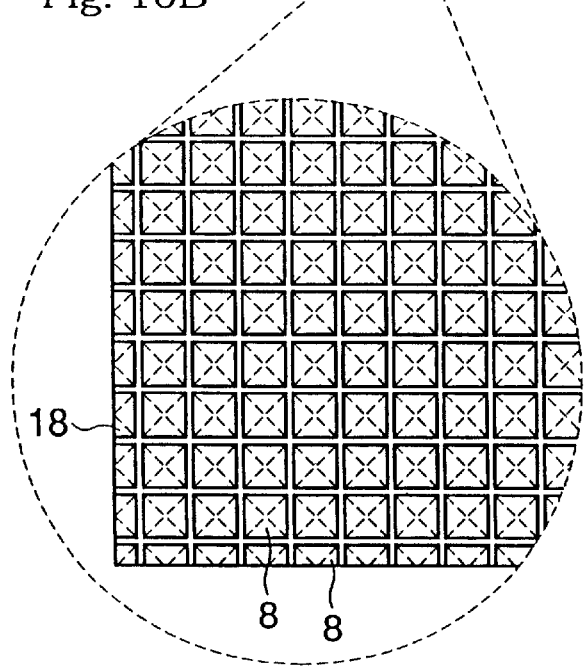
FIG. 10B is a partially enlarged view of FIG. 10A.
Figure 10C:
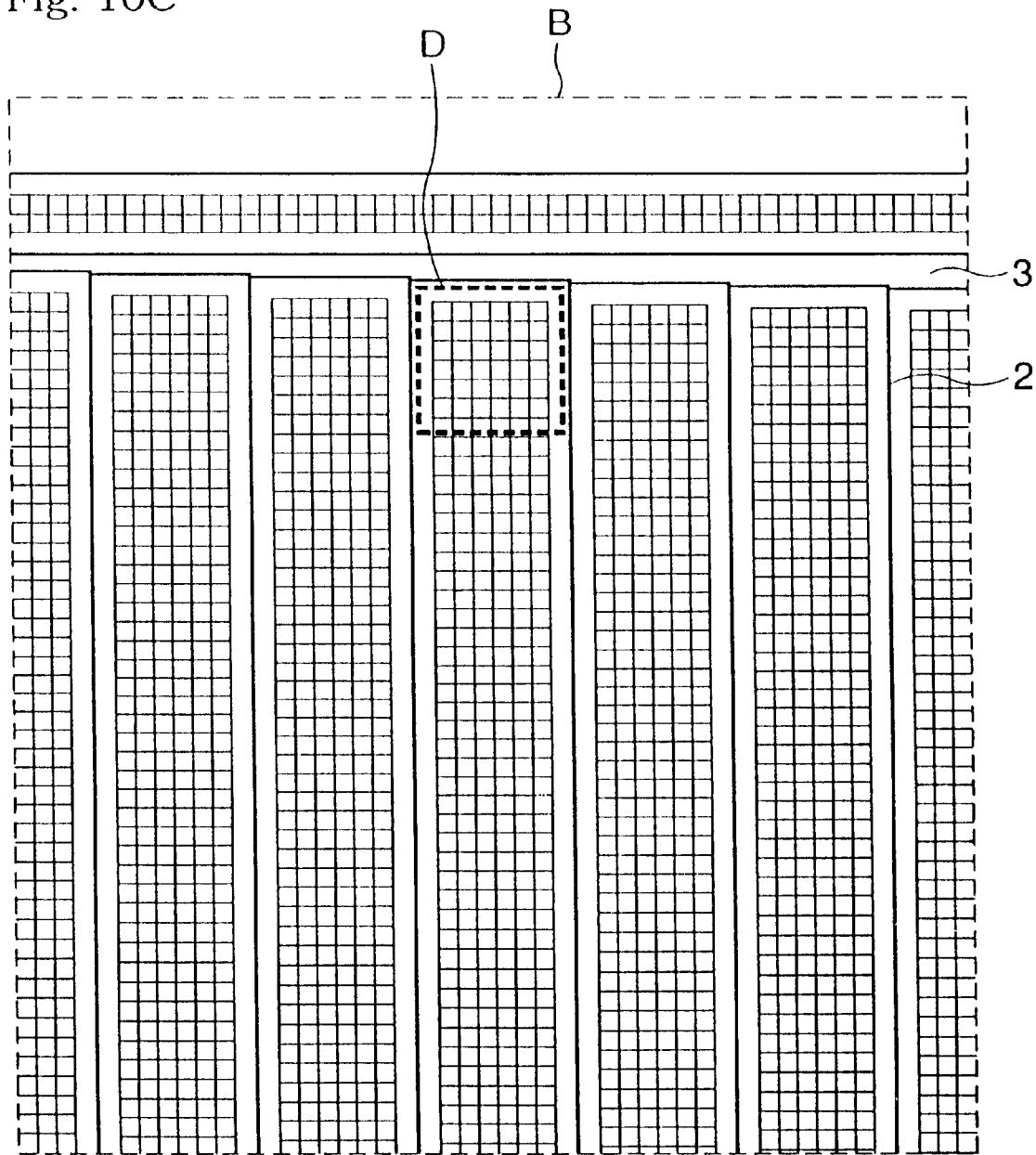
FIG. 10C is an enlarged plan view showing a portion indicated by symbol B in FIG. 10A.
Figure 11:
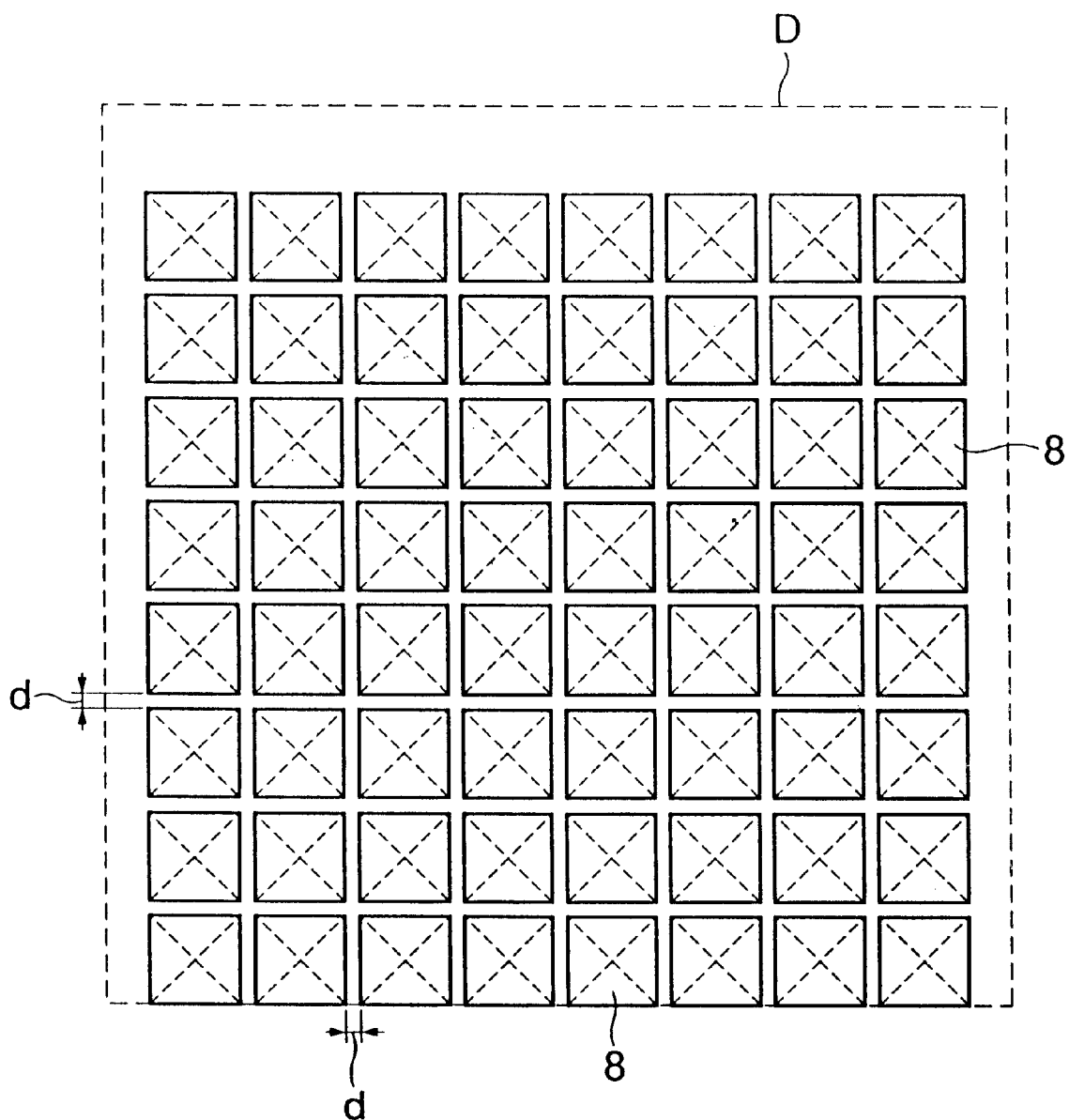
FIG. 11 is an enlarged plan view showing a portion indicated by symbol D in FIG. 10C.

FIG. 7 shows another, further modified embodiment of the present invention. In the texture region F, textures 9k and 9m are formed in the peripheral portion and in the inside portion of the texture region F, respectively. The textures 9k formed in the inside portion of the texture region F have a V-groove shape, whereas the textures 9m formed in the peripheral portion of the texture region F have an inverted-pyramid shape. In this case also, a larger texture area occupied by the textures 9k and 9m can be ensured, as compared with a conventional cell, by forming the textures 9m in the peripheral portion of the texture region F.

In these embodiments, explanation has been given on the textures 9a and 9f having an inverted-pyramid shape and the textures 9k having a V-groove shape, and a combination of textures having other shapes has not been particularly mentioned. However, the present invention can also be applied to the combination of textures having other shapes.

Further, although the explanation in this embodiment has been given by referring to a solar battery cell of NRS/BSF type, the present invention can also be applied to a solar battery cell of NRS/LBSF type or a solar battery cell using a crystal other than silicon because these are different from the NRS/BSF type only in structures or crystals.

As shown and described above, the present invention produces the following effects.

(1) The electric output power can be improved because a larger area occupied by the textures can be provided as compared with a conventional cell.

Especially, in the case of a solar battery cell for use in space, it is effective to form a larger texture area in improving the output of the solar battery cell in order to reduce the influence on the carrier lifetime by deterioration due to radioactive rays.

(2) Further, since a flat non-texture region is provided on the outer perimeter of the solar battery cell to the extent that the output power does not decrease so much, generation of cracks or cleavages can be prevented, thereby providing a highly productive and highly reliable device.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

What we claim is:

1. A solar battery cell having textures formed in a texture region on a light-receiving surface thereof, except for a site where a surface electrode is formed, wherein the textures formed in a peripheral portion of the texture region have a different size from the textures formed in an inside portion located inside of the peripheral portions;

wherein the textures formed in the peripheral portion of the texture region have a smaller size than the textures formed in the inside portion of the texture region.

2. The solar battery cell of claim 1, wherein a distance between adjacent textures formed in the peripheral portion of the texture region is different from a distance between adjacent textures formed in the inside portion of the texture region.

3. The solar battery cell of claims 2, wherein the distance between adjacent textures formed in the peripheral portion of the texture region is larger than the distance between adjacent textures formed in the inside portion of the texture region.

4. The solar battery cell of claim 1, wherein the light-receiving surface includes a non-texture region which is formed on an outer perimeter of the cell and in which textures are not formed.

5. The solar battery cell of claim 4, wherein the non-texture region has a width of 50 μm or more.

6. The solar battery cell of claim 1, wherein the solar battery cell is an NRS/BSF type solar battery cell.

7. The solar battery cell of claim 1, wherein said light-receiving surface includes a plurality of surface electrode portions and a plurality of textured regions, each said textured region being disposed adjacent respective said surface electrodes such that the peripheral portion thereof is disposed intermediate said inward portion and said respective surface electrodes so that the peripheral portions having reduced size textures are disposed adjacent the electrode portions.

8. A solar battery cell having textures formed in a texture region on a light-receiving surface thereof except for a site where a surface electrode is formed, wherein the textures formed in a peripheral portion of the texture region have a different shape from the textures formed in an inside portion located inside of the peripheral portion;

wherein the textures formed in the inside portion of the texture region have an inverted-pyramid shape with a square base, and the textures formed in the peripheral portion of the texture region have an inverted-pyramid shape with a polygonal base having a pointed end.

9. The solar battery cell of claim 8, wherein a distance between adjacent textures formed in the peripheral portion of the texture region is different from a distance between adjacent textures formed in the inside portion of the texture region.

10. The solar battery cell of claim 8, wherein a distance between adjacent textures formed in the peripheral portion of the texture region is larger than the distance between adjacent textures formed in the inside portion of the texture region.

11. The solar battery cell of claim 8, wherein the light-receiving surface includes a non-texture region which is formed on an outer perimeter of the cell and in which textures are not formed.

12. The solar battery cell of claim 11, wherein the non-texture region has a width of 50 $\mu$m or more.

13. The solar battery cell of claim 8, wherein said light-receiving surface includes a plurality of surface electrode portions and a plurality of textured regions, each said textured region being disposed adjacent respective said surface electrodes such that the peripheral portion thereof is disposed intermediate said inward portion and said respective surface electrodes so that the peripheral portions having inverted-pyramid shape textures with a polygonal base are disposed adjacent the electrode portions.

14. A solar batter cell having textures formed in a texture region on a light-receiving surface thereof except for a site where a surface electrode is formed, wherein the textures formed in a peripheral portion of the texture region have a different shape from the textures formed in an inside portion located inside of the peripheral portion, wherein the textures formed in the inside portion of the texture region have a V-groove shape, and the textures formed in the peripheral portion of the texture region have an inverted-pyramid shape.

15. The solar battery cell of claim 14, wherein a distance between adjacent textures formed in the peripheral portion of the texture region is different from a distance between adjacent textures formed in the inside portion of the texture region.

16. The solar battery cell of claim 14, wherein a distance between adjacent textures formed in the peripheral portion of the texture region is larger than the distance between adjacent textures formed in the inside portion of the texture region.

17. The solar battery cell of claim 14, wherein the light-receiving surface includes a non-texture region which is formed on an outer perimeter of the cell and in which textures are not formed.

18. The solar battery cell of claim 17, wherein the non-texture region has a width of 50 $\mu$m or more.

19. The solar battery cell of claim 14, wherein said light-receiving surface includes a plurality of surface electrode portions and a plurality of textured regions, each said textured region being disposed adjacent respective said surface electrodes such that the peripheral portion thereof is disposed intermediate said inward portion and said respective surface electrodes so that the peripheral portions having inverted-pyramid shape textures are disposed adjacent the electrode portions.

* * * * *